US006780719B2

(12) United States Patent
Niimi et al.

(10) Patent No.: US 6,780,719 B2
(45) Date of Patent: Aug. 24, 2004

(54) METHOD FOR ANNEALING ULTRA-THIN, HIGH QUALITY GATE OXIDE LAYERS USING OXIDIZER/HYDROGEN MIXTURES

(75) Inventors: Hiroaki Niimi, Richardson, TX (US); Rajesh Khamankar, Coppell, TX (US); James J. Chambers, Plano, TX (US); Sunil Hattangady, McKinney, TX (US); Antonio L. P. Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 65 days.

(21) Appl. No.: 09/885,744

(22) Filed: Jun. 20, 2001

(65) Prior Publication Data

US 2002/0197886 A1 Dec. 26, 2002

(51) Int. Cl.[7] .............................................. H01L 21/336
(52) U.S. Cl. ..................... 438/287; 438/762; 438/763; 438/775; 438/776; 438/777
(58) Field of Search ................................ 438/197, 216, 438/261, 287, 762, 763, 775, 776, 777, 288, 769, 770, 787, 791

(56) References Cited

U.S. PATENT DOCUMENTS

| | | | | |
|---|---|---|---|---|
| 6,136,654 A | * | 10/2000 | Kraft et al. | ................. 438/287 |
| 6,235,590 B1 | * | 5/2001 | Daniel et al. | ............... 438/275 |
| 6,391,724 B1 | * | 5/2002 | Park | ............................ 438/279 |
| 2001/0027004 A1 | * | 10/2001 | Part et al. | |
| 2002/0146914 A1 | * | 10/2002 | Huang et al. | |

OTHER PUBLICATIONS

Park et al. Pub. US 2001/027004 Semiconductor Device Having Capacitor And Method Of Manufacturing Teh Same, Aug. 16, 2001.*

Weimer et al. Pub. US 2001/0014522 Forming A Conductive Structure In A Semiconductor Device, Aug. 16, 2001.*

* cited by examiner

Primary Examiner—W. David Coleman
Assistant Examiner—Khiem D Nguyen
(74) Attorney, Agent, or Firm—W. James Brady, III; Frederick J. Telecky, Jr.

(57) ABSTRACT

An embodiment of the present invention is a method of forming an ultra-thin dielectric layer, the method comprising the steps of: providing a substrate having a semiconductor surface; forming an oxygen-containing layer on the semiconductor surface; exposing the oxygen-containing layer to a nitrogen-containing plasma to create a uniform nitrogen distribution throughout the oxygen-containing layer; and re-oxidizing and annealing the layer to stabilize the nitrogen distribution, heal plasma-induced damage, and reduce interfacial defect density.

This annealing step is selected from a group of four re-oxidizing techniques:

- Consecutive annealing in a mixture of H2 and N2 (preferably less than 20% H2), and then a mixture of O2 and N2 (preferably less than 20% O2);
- annealing by a spike-like temperature rise (preferably less than 1 s at 1000 to 1150° C.) in nitrogen-comprising atmosphere (preferably N2/O2 or N2O/H2);
- annealing by rapid thermal heating in ammonia of reduced pressure (preferably at 600 to 1000° C. for 5 to 60 s);
- annealing in an oxidizer/hydrogen mixture (preferably N2O with 1% H2) for 5 to 60 s at 800 to 1050° C.

12 Claims, 5 Drawing Sheets

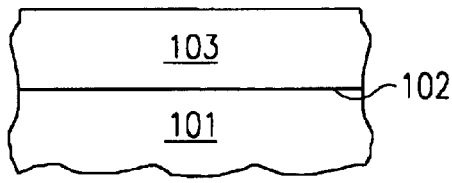
FIG. 1A
FIG. 1B
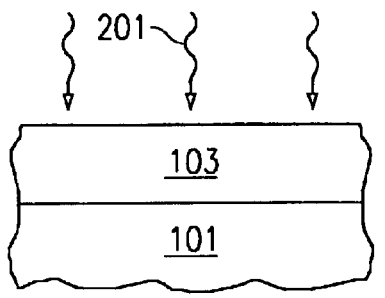
FIG. 2A
FIG. 2B
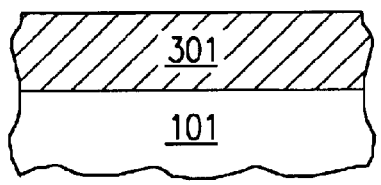
FIG. 3A
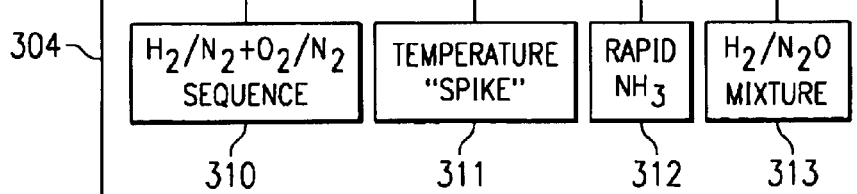
FIG. 3B

METHOD FOR ANNEALING ULTRA-THIN, HIGH QUALITY GATE OXIDE LAYERS USING OXIDIZER/HYDROGEN MIXTURES

FIELD OF THE INVENTION

The present invention is related in general to the field of electronic systems and semiconductor devices and more specifically to the fabrication and processing of ultra-thin gate dielectric layers.

DESCRIPTION OF THE RELATED ART

The trend in semiconductor technology to double the functional complexity of its products every 18 months (Moore's "law"), which is still valid today after having dominated the industry for the last three decades, has several implicit consequences. First, the cost per functional unit should drop with each generation of complexity so that the cost of the product with its doubled functionality would increase only slightly. Second, the higher product complexity should largely be achieved by shrinking the feature sizes of the chip components while holding the package dimensions constant; preferably, even the packages should shrink. Third, the increased functional complexity should be paralleled by an equivalent increase in reliability of the product. And fourth, but not least, the best financial profit rewards were held out for the ones who were ahead in the marketplace in reaching the complexity goal together with offering the most flexible products for application.

The scaling of the components in the lateral dimension requires vertical scaling as well so as to achieve adequate device performance. This vertical scaling requires the thickness of the gate dielectric, commonly silicon dioxide ($SiO_2$) to be reduced. Thinning of the gate dielectric provides a smaller barrier to dopant diffusion from a poly-silicon gate structure (or metal diffusion from a metal gate structure) through the underlying dielectric, often resulting in devices with diminished electrical performance and reliability. In ultra-thin dielectric layers, interfaces with their unwelcome electronic states and carrier traps may finally dominate the electrical characteristics.

One way of reducing these problems is to use silicon nitride as the gate dielectric layer instead of silicon dioxide. Silicon nitride has a higher dielectric constant than typical thermally grown $SiO_2$ and provides greater resistance to impurity diffusion. However, the electrical properties of standard deposited silicon nitride films are far inferior to thermal oxides. One approach for silicon nitride films as gate insulators employs an oxide layer between the nitride layer and the substrate; see Xie-wen Wang et al., "Highly Reliable Silicon Nitride Thin Films Made by Jet Vapor Deposition", Japan J. Appl. Phys., vol.34, pp. 955–958, 1995. Unfortunately, this technique has numerous practical shortcomings.

Another approach of maintaining the benefit of the electrical properties of the oxide film while also getting the barrier properties of a nitride film is to incorporate nitrogen into a gate oxide layer. In known technology, this is accomplished by a nitrided oxide process involving ammonia to penetrate the gate oxide at temperatures in excess of 1000° C. Once the high temperature reaction has begun, it is difficult to control the concentration of the nitrogen incorporated into the gate oxide. Excessive nitrogen near the interface between the semiconductor substrate and the gate oxide can adversely affect the threshold voltage and degrade the channel mobility of the device due to charged interface traps associated with the nitrogen.

As described by S. V. Hattangady et al., "Controlled Nitrogen Incorporation at the Gate Oxide Surface", Appl.Phys.Lett. vol. 66. p.3495, 1995, a high pressure and low power process provides nitrogen incorporation specifically at the gate/conductor interface. The long exposure time to the plasma increases the probability of charge-induced damage to the oxide and reduces the production throughput.

In U.S. Pat. No. 6,136,654, issued on Oct. 24, 2000 (Kraft et al., "Method of Forming Thin Silicon Nitride or Silicon Oxynitride Gate Dielectrics"), the $SiO_2$ (or oxynitride) layer is subjected to a nitrogen-containing plasma so that the nitrogen is either incorporated into the $SiO_2$ layer or forms a nitride layer at the surface of the substrate. The source of nitrogen in the plasma is comprised of a material consisting of $N_2$, $NH_3$, $NO$, $N_2O$, or mixtures thereof. This method provides a non-uniform nitrogen distribution in the $SiO_2$ layer and is applicable to relatively thick oxide layers (1 to 15 nm) ; it is not suitable for ultra-thin $SiO_2$ layers (0.5 to 2 nm).

An urgent need has, therefore, arisen for a coherent, low-cost method of plasma nitridation and re-oxidation and damage healing of ultra-thin gate oxide layers. The method should further produce excellent electrical device performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

An embodiment of the present invention is a method of forming an ultra-thin dielectric layer, the method comprising the steps of: providing a substrate having a semiconductor surface; forming an oxygen-containing layer on the semiconductor surface; exposing the oxygen-containing layer to a nitrogen-containing plasma to create a uniform nitrogen distribution throughout the oxygen-containing layer; and re-oxidizing and annealing the layer to stabilize the nitrogen distribution, heal plasma-induced damage, and reduce interfacial defect density.

This annealing step is selected from a group of four re-oxidizing techniques:

Consecutive annealing in a mixture of $H_2$ and $N_2$ (preferably less than 20% $H_2$ ), and then a mixture of $O_2$ and $N_2$ (preferably less than 20% $O_2$);

annealing by a spike-like temperature rise (preferably less than 1 s at 1000 to 1150° C.) in nitrogen-comprising atmosphere (preferably $N_2/O_2$ or $N_2O/H_2$ );

annealing by rapid thermal heating in ammonia of reduced pressure (preferably at 600 to 1000° C. for 5 to 60 s);

annealing in an oxidizer/hydrogen mixture (preferably $N_2O$ with 1% $H_2$ ) for 5 to 60 s at 800 to 1050° C.

Another embodiment of the present invention is a method of forming a transistor having a conductive gate structure disposed on an ultra-thin gate dielectric layer, the method comprising the steps of: Providing a substrate having a semiconductor surface; providing an ultra-thin oxygen-containing dielectric layer, preferably $SiO_2$ or an oxynitride, on the semiconductor surface; subjecting the dielectric layer to a nitrogen-containing plasma so that a uniform nitrogen distribution is created throughout the oxygen-containing layer; subjecting the nitrided oxygen-containing layer to an annealing and re-oxidation step selected from techniques listed above; and wherein the gate dielectric layer is comprised of the annealed dielectric layer having the uniform and stabilized nitrogen distribution. Preferably, the conductive gate structure is comprised of doped poly-silicon or a metal. Forming the source, drain and contacts completes the transistor.

Another embodiment of the present invention is a method of forming a capacitor having a capacitor dielectric comprising the steps of: Providing a substrate having a semiconductor surface; forming a first electrode over the semiconductor surface; providing an ultra-thin dielectric layer on the first electrode, the dielectric layer comprised of an oxide, preferably SiO2 or an oxynitride; subjecting the dielectric layer to a nitrogen-containing plasma so that nitrogen is uniformly distributed throughout the layer; annealing the dielectric layer; forming a second electrode on the dielectric layer; wherein the capacitor dielectric layer is comprised of the annealed dielectric layer having the uniform and stabilized nitrogen distribution.

It is a technical advantage of the present invention that it is equally applicable to NMOS and PMOS transistors with ultra-thin gate oxides. The invention is well suited for the continuing trend of device miniaturization.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIGS. 1, 2 and 3 are schematic cross sections of an integrated circuit structure as it is fabricated following the flow of process steps 1, 2 and 3 of the first embodiment of the invention.

FIG. 2 further indicates details of the nitridation process step.

FIG. 3 further indicates options and details of the re-oxidation and annealing process step.

DETAILED DESCRIPTION OF THE PREFERRED EMBODIMENTS

Figure 4A:
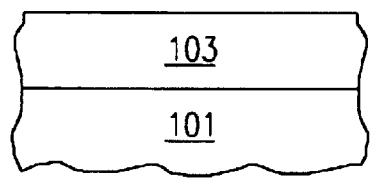
FIG. 4 shows schematic cross sections of an integrated circuit structure as it is fabricated following the process flow of the second embodiment of the invention.
Figure 4B:
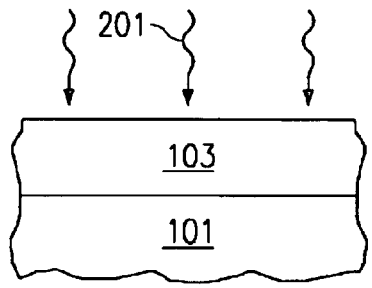
Figure 4C:
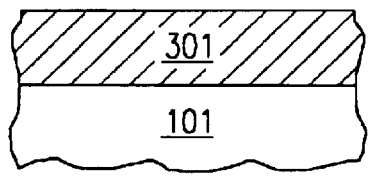
Figure 4D:
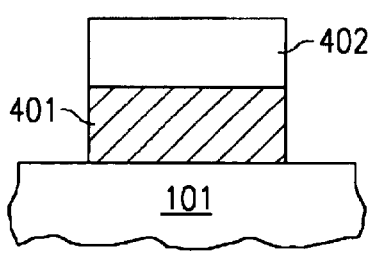
Figure 5A:
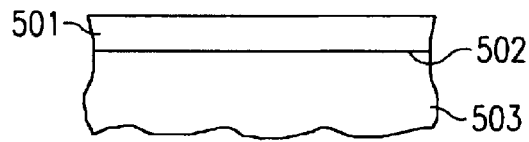
FIG. 5 shows schematic cross sections of an integrated circuit structure as it is fabricated following the process flow of the third embodiment of the invention.
Figure 5B:
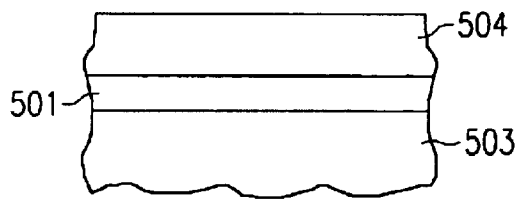
Figure 5C:
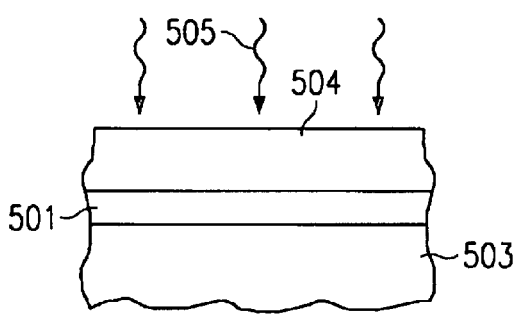
Figure 5D:
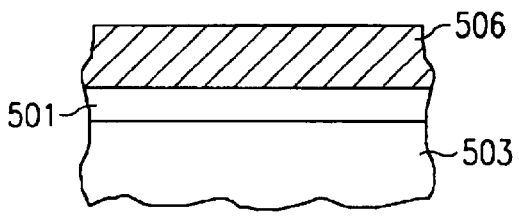
Figure 5E:
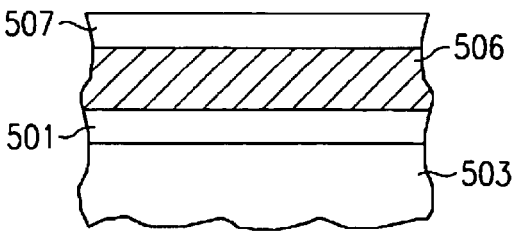

The present invention is related to U.S. Pat. No. 6,136,654, issued on Oct. 24, 2000 (Kraft et al., "Method of Forming Thin Silicon Nitride or Silicon Oxynitride Gate Dielectrics").

FIGS. 1, 2 and 3 illustrate the 3-step process flow of growing, nitriding, and annealing ultra-thin oxide layers according to the invention. The following description is centered around two embodiments of the invention, the process features and the formation of a gate dielectric, the methods of the invention are not limited to gate dielectrics. The embodiments can be used to form other layers required in the production of semiconductor devices. For example, the invention can be used to form the dielectric material in a capacitor structure, or to isolate conductive structures. Furthermore, the semiconductor does not necessarily have to be silicon (n-type or p-type), but may be silicon germanium, gallium arsenide or another III–V compound, or another compound material used in semiconductor device manufacturing.

In FIG. 1, the substrate 101 is preferably a silicon substrate or an epitaxial silicon layer formed on a silicon substrate. It may generally be a substrate with a semiconductor surface 102. An insulating layer 103 is formed on surface 102. Layer 103 contains oxygen, and is preferably silicon dioxide SiO2. Other oxygen-containing insulating materials for layer 103 include oxynitride and other insulators. Preferably, layer 103 is grown by the process step 104 of rapid thermal oxidation in a furnace. The preferred thickness range is between 0.8 and 2.0 nm. Consequently, layer 103 is classified as "ultra-thin". While the following description of the invention also holds for deposited insulating layers 103, the electrical quality of deposited ultra-thin oxygen-containing layers has so far been inferior to thermally grown layers.

In FIG. 2, the process step 204 of plasma nitridation of layer 103 is illustrated. The oxygen-containing layer 103 is exposed to plasma 201 which contains nitrogen. A preferred gas composition of the plasma is 75% helium and 25% nitrogen at a pressure of 20 to 80 mTorr. The plasma nitrogen concentration may vary from 10% to 25%, with helium providing the balance. Instead of helium, neon or argon may be chosen. A source of nitrogen is introduced into the plasma to form the nitrogen-containing plasma. The source of nitrogen comprises a material selected from a group consisting of N2, NH3, NO, N2O, and a mixture thereof. The plasma operates at 10 to 50 W for 10 to 60 s. The substrate can be unbiased in which case the ionized substances are accelerated by the plasma potential (which is typically on the order of 20 V) and then implanted into the insulating surface. A bias voltage can be applied to the substrate to further accelerate the ions from the plasma and implant them deeper into the insulating layer. Either a dc or a rf bias voltage can be used to bias the substrate.

It is an important aspect of the present invention that the plasma nitridation process creates a uniform nitrogen distribution throughout layer 103. Details about the method and the results are described in more detail in FIGS. 6 and 7.

In FIG. 3, the oxygen-containing insulating layer with uniform nitrogen distribution throughout, designated 301, is subjected to the process step 304 of annealing and re-oxidation, another important aspect of the present invention. This annealing step 304 is selected from a group of four re-oxidizing techniques:

Step 310: Consecutive annealing in a mixture of H2 and N2, and the a mixture of O2 and N2. Detail described in FIG. 8.

Step 311: Annealing by a "spike"-like temperature rise in nitrogen-comprising atmosphere. Detail described in FIGS. 9A and 9B.

Figure 10:
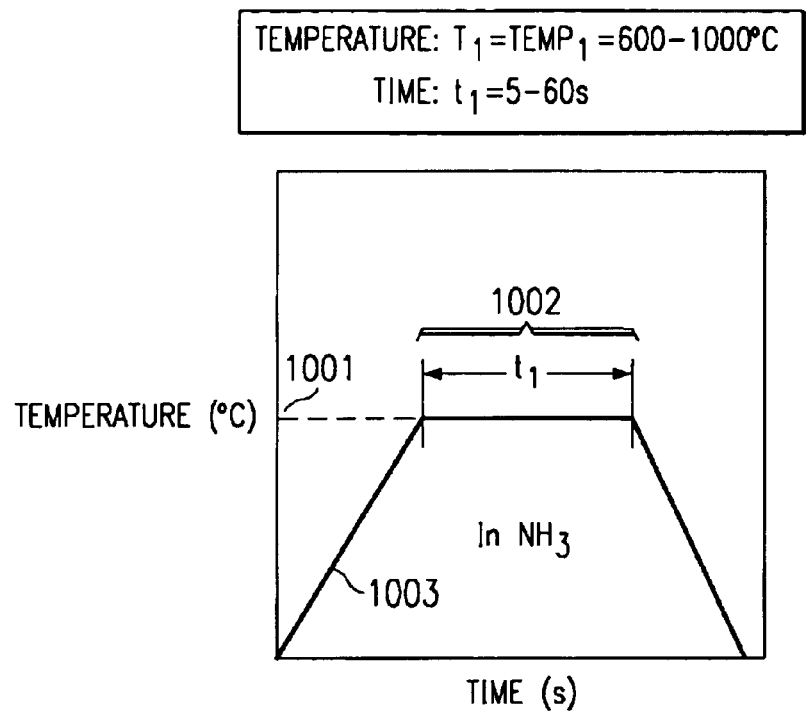
FIG. 10 is a temperature profile of the rapid ammonia annealing process of the invention.

Step 312: Annealing by rapid thermal heating in ammonia of reduced pressure. Detail described in FIG. 10.

Step 313: Annealing in an oxidizer/hydrogen mixture (preferably a H2/N2O mixture). Detail described in FIG. 11.

Any one of these four re-oxidation techniques of the present invention provides healing of the plasma-induced damage, stabilization of the nitrogen distribution, and reduction the interfacial defect density. The reduced interface state density, in turn, provides higher carrier mobility (for instance, electron mobility) in the channel of the transistor formed with the stabilized dielectric layer as gate dielectric.

Referring to the embodiment of FIG. 4, the process flow of forming a transistor gate having an ultra-thin gate dielectric layer is schematically shown. Gate insulator 103 is formed on semiconductor substrate 101 (preferably a silicon substrate or a silicon epitaxial layer) preferably in a thermal growing process as described above. The preferred result is an ultra-thin (about 0.8 to 2.0 nm thick) oxygen-containing layer such as silicon dioxide or oxynitride. Next, the substrate is subjected to a nitrogen-containing plasma 201, provided by a nitrogen-containing source such as N2, NH3, NO, or N2O. This nitridation process results in a layer 301 having a uniform distribution of nitrogen throughout the oxygen-containing layer.

In order for dielectric layer 301 to be used as a transistor gate dielectric, a conductive gate structure 402 is deposited and patterned on the gate dielectric layer 401. Typically, gate structure 402 is comprised of doped poly-silicon or metal. Finally, source and drain of the transistor are formed, together with their respective contacts (not shown in FIG. 4).

Referring to the embodiment of FIG. 5, the process flow of forming a capacitor having an ultra-thin capacitor dielectric layer is schematically shown. A small portion of the integrated circuit provides first electrode 501 deposited over the semiconductor surface 502 of substrate 503. The dielectric layer 504 is then deposited over the first electrode 501. Preferably, it is an ultra-thin silicon dioxide or oxynitride layer in the thickness range 0.8 to 2.0 nm. The arrangement is subjected to an oxygen-containing plasma 505, provided by a nitrogen-containing source such as N2, NH3, NO, or N2O. This nitridation process results in a layer 506 having a uniform distribution of nitrogen throughout the oxygen-containing layer. A second electrode 507 is formed on the dielectric layer 506, completing the fabrication of a capacitor with the ultra-thin dielectric layer 506.

Figure 6:
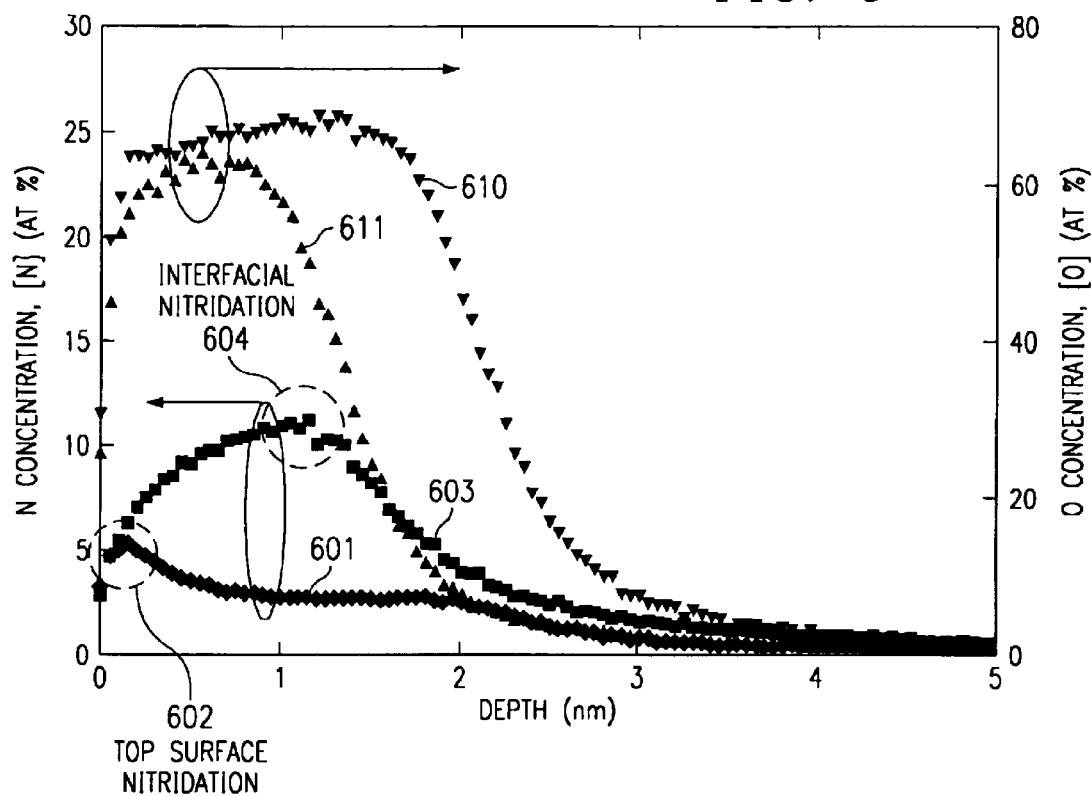
FIG. 6 is a graph illustrating the amounts and locations of nitrogen and oxygen in a silicon dioxide layer, as they contribute to the nitridation technique of the invention.
Figure 7:
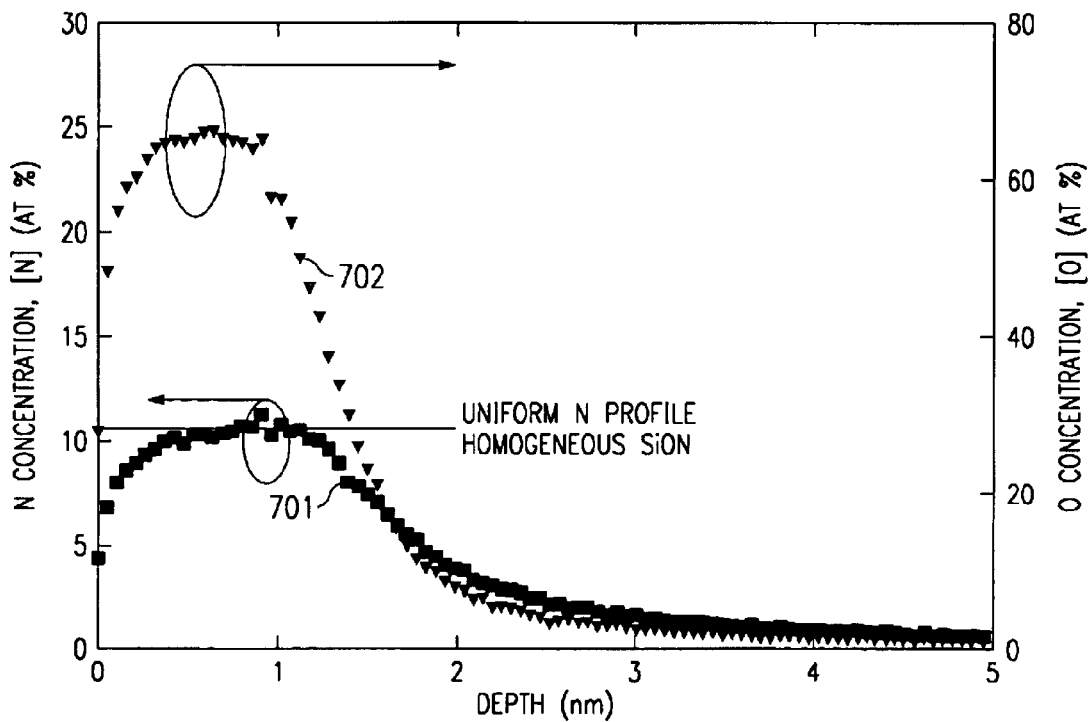
FIG. 7 is a graph illustrating the amounts and locations of nitrogen and oxygen in an ultra-thin silicon dioxide layer for the optimized nitridation technique of the invention.

The formation of a uniform SiON layer by plasma nitridation according to this invention is shown in more detail in the examples of the Time-of-Flight Secondary Ion Mass Spectroscopy (ToF SIMS) profiles of FIGS. 6 and 7. In both figures, the nitrogen concentration (in %) is plotted as a function of depth (measured in nm) on the left hand side, and the oxygen concentration (in %) as a function of depth (in nm) on the right hand side. A preferred plasma of this invention is a mixture of 75% He and 25% nitrogen at a pressure of 20 to 80 mTorr, operated at an rf power of 100 to 300 W and a flow rate of 200 to 400 standard cm3/min for 10 to 60 s.

It has been observed that for relatively thick (2 to 3 nm) oxide layers, charged metastable nitrogen plasma ions create a top surface nitridation; see region 602 of curve 601 in FIG. 6. In contrast, for ultra-thin (0.8 to 2 nm) oxide layers, these charged metastable nitrogen ions create an interfacial nitridation, see region 604 of curve 603. For the nitrogen profile in ultra-thin SiO2 layers of FIG. 7, this effect is combined with the distribution of the neutral metastable nitrogen ions. These ions create a maximum of implanted nitrogen close to the surface. N2+ radical generation is suppressed. Consequently, the combined nitrogen profile 701 of these distributions exhibits an approximately uniform nitrogen concentration from the surface to a depth of about 1.5 nm, resulting in an homogeneous nitrogen distribution in the ultrathin SiO2 layer.

For the oxygen distribution, the SIMS profiles examples in FIG. 6 indicate, as expected, a practically uniform oxygen concentration in relatively thick oxide layers (profile 610, uniform to a depth of about 1.7 nm) as well as ultra-thin layers (profile 611, uniform to a depth of about 1.0 nm). For ultra-thin layers, the observed oxygen uniformity is confirmed by profile 702 in FIG. 7. The combination of the examples of uniform nitrogen and oxygen distributions of FIGS. 6 and 7 results in a homogeneous SiON distribution in ultra-thin oxide layers.

Figure 8:
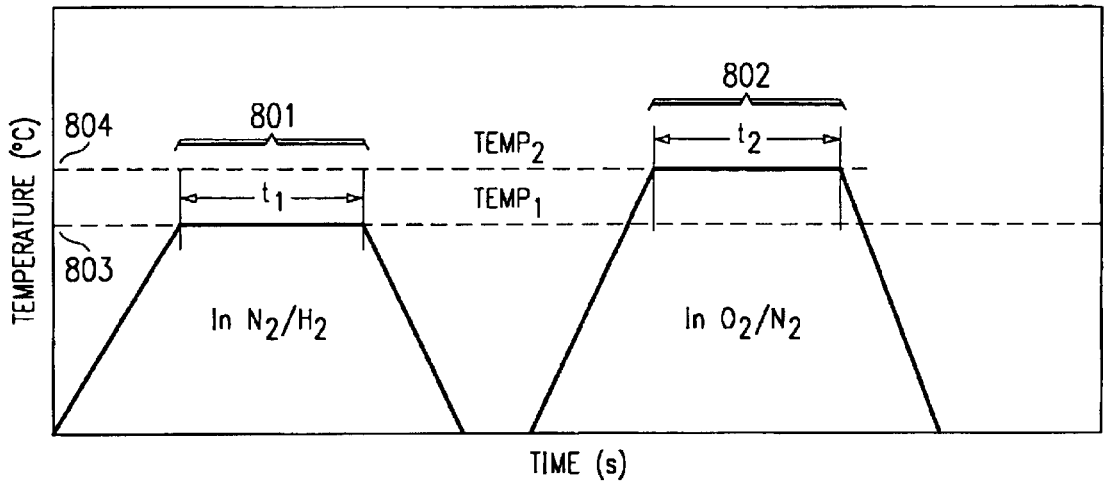
FIG. 8 is a temperature profile of the sequential H2/N2 and O2N2 annealing process of the invention.

FIG. 8 illustrates the temperature-time sequence (not to scale) of the annealing and re-oxidation method using consecutively a mixture of H2 and N2 and then O2 and N2 according to the present invention. This method is intended to heal plasma-induced damage after the nitrogen-containing plasma exposure of ultra-thin oxygen-containing layers (0.8 to 2.0 nm). The N2/H2 mixture contains a maximum of 20% H2 (a successful concentration may only be 1%) with the balance N2, and the O2N2 mixture contains a maximum of 20% O2 with the balance N2. For each one of these mixtures, the preferred exposure time (801 and 802 in FIG. 8) is between 5 and 60 s, the pressure 2 to 50 Torr, and the flow rate 1 to 20 standard liters/min. For the N2/H2 mixture, the preferred temperature 803 is selected between 600 and 1000° C., and for the O2/N2 mixture between 800 and 1000° C. It is essential that these two annealing steps are executed consecutively without substantial delay between them. Under these annealing conditions, plasma-induced damage of the layer can be healed, resulting in reduction of interfacial defect density and thus improvement of channel carrier mobility, the nitrogen distribution stabilized, and oxide-regrowth minimized.

Figure 9A:
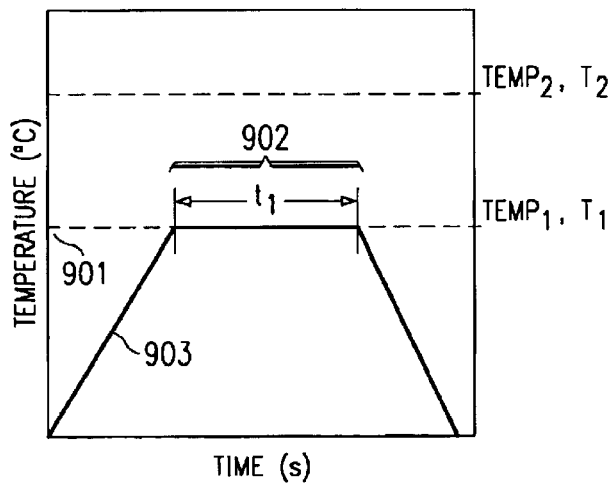
FIG. 9A is a temperature profile of the conventional rapid thermal annealing process.
Figure 9B:
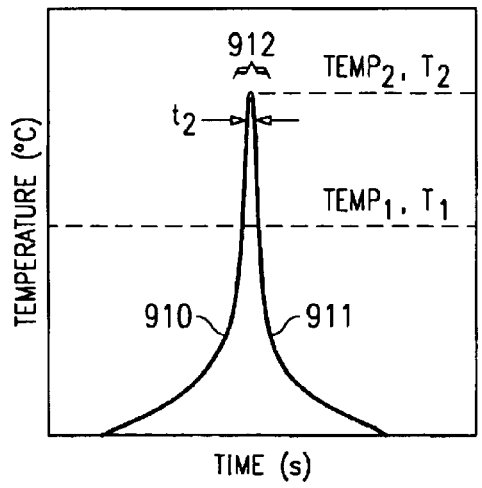
FIG. 9B is a temperature profile of the temperature "spike" annealing process of the invention.

FIGS. 9A and 9B compare the temperature-time sequences (not to scale) of the annealing and re-oxidation method of this invention using a "spike"-like temperature exposure in nitrogen-comprising gas with the conventional rapid thermal method. Both FIGS. 9A and 9B plot the temperature-time diagram of the process depicted. For the conventional rapid thermal process in FIG. 9A, temperature T1 (designated 901) is between 600 and 1000° C., and the time-span t1 (designated 902) is between 5 and 60 s. This method tends to result in a non-uniform nitrogen distribution in the oxide layer, with a nitrogen-containing portion close to the surface, and a nitrogen-deficient SiO2 or SiO portion at the interface to the semiconductor substrate. The heating ramp 903 is not critical for this process.

In contrast, the temperature "spike" process of the present invention (FIG. 9B) uses a temperature up-ramp rate 910 of 25 to 200° C./s and a down-ramp rate 911 of 25 to 100° C./s. Thus, the peak temperature T2 of 1000 to 1150° C. is rapidly reached and rapidly departed from. The time t2 (designated 912) at the peak temperature is less than 1 s. The nitrogen-comprising gas mixture is selected from a group consisting of O2/N2, O2He, O2Ne, O2Ar, and H2/N2O. Preferably, the O2N2 mixture contains a maximum of 20% O2 with the balance N2, and the H2/N2O mixture contains a maximum 20% H2 with the balance N2O. With this annealing method, undesirable interface states can be minimized, resulting in high channel carrier mobility; the nitrogen distribution is uniform and stabilized, with low if any excess oxide at the interface; and plasma-induced damage of the oxide layer is healed.

As stated above, in known technology a nitrided oxide process involves ammonia to penetrate the gate oxide at temperatures in excess of 1000° C. Once the high temperature reaction has begun, it is difficult to control the concentration of the nitrogen incorporated into the gate oxide. Excessive nitrogen near the interface between the semiconductor substrate and the gate oxide can adversely affect the threshold voltage and degrade the channel mobility of the device through Coulomb effects of the fixed charge and interface trap charge associated with the nitrogen on the carriers within the channel region.

In contrast to the nitridation process of known technology, this invention uses ammonia for an annealing process of ultra-thin oxide layers under much different conditions. The process is depicted in the temperature/time plot of FIG. 10. The process operates at the temperature T1 of only 600 to 1000° C. (designated 1001 in FIG. 10) for a time-span t1 (designated 1002) of 5 to 60 s. The up-ramp rate of 25 to 80° C./s is relatively fast. The down-ramp rate is arbitrary. The dry ammonia is operated at the reduced pressure of 2 to 50 Torr.

This ammonia annealing process stabilizes uniform nitrogen distribution (which would be more difficult to achieve in N2O gas). Further, it minimizes the plasma nitridation damage and the fixed interface state density and charges. The re-oxidation is negligible.

Figure 11:
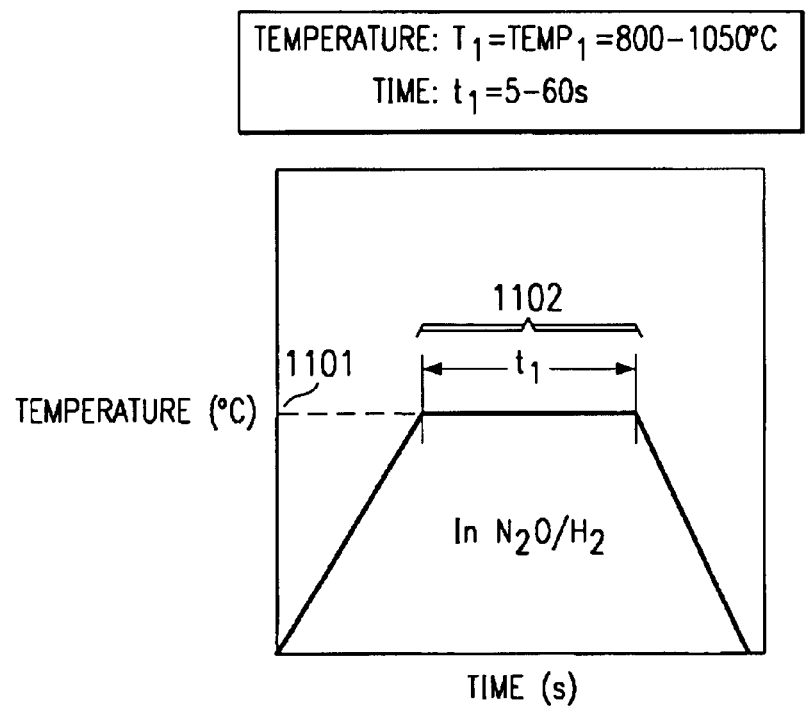
FIG. 11 is a temperature profile of the H2/N2O mixture annealing process of the invention.

FIG. 11 illustrates the temperature/time sequence (not to scale) of the annealing and re-oxidation method using the oxidizer and hydrogen mixture of N2O and H2. Here, the N2O is replacing O2 in order to keep the re-oxidation rate at a minimum while stabilizing the nitrogen distribution. But in principle, the oxidizer and hydrogen mixture may also comprise NO and H2, or O2 and H2. The preferred mixture contains 0.5 to 30% H2 (preferred content 1%) with the balance being N2O.

As FIG. 11 shows, the anneal step in N2O and H2 comprises a time-span t1 (designated as 1102) of 5 to 60 s at the temperature T1 (designated as 1101) of 800 to 1000° C. The oxidizer and hydrogen mixture is flowing at 1 to 20 standard liters/min at 2 to 50 Torr.

This oxidizer and hydrogen mixture stabilizes the nitrogen distribution in the ultra-thin oxide layer and creates low interface state density, resulting in higher carrier (especially electron) mobility in the transistor channel.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method for forming an integrated circuit structure, comprising the steps of:

providing a substrate having a semiconductor surface;

forming an oxygen-containing layer on said semiconductor surface; then subsequently forming a uniform nitrogen distribution throughout said oxygen-containing layer; and subsequently re-oxidizing said layer by a rapid anneal step in an oxidizer and hydrogen mixture of N2O and H2 for stabilizing the nitrogen distribution, healing plasma-induced damage, and reducing interfacial defect density.

2. The method according to claim 1 wherein said oxygen-containing layer is an ultra-thin silicon dioxide layer in the thickness range from 0.6 to 2.0 nm.

3. The method according to claim 1 wherein said oxygen-containing layer is an oxynitride layer.

4. The method according to claim 1 wherein said step of forming an oxide is a rapid thermal oxidation.

5. The method according to claim 1 wherein said anneal steps comprise 5 to 60 s at 800° to 1050° C. in N2O/H2, flowing at 1 to 20 standard liters/min at 2 to 50 Torr.

6. The method according to claim 5 wherein said N2O/H2 mixture contains 0.5 to 30% H2 with the balance N2O.

7. The method according to claim 1 wherein said oxidizer and hydrogen mixture comprises NO and H2, or O2 and H2.

8. The method according to claim 1 wherein said integrated circuit structure includes a transistor having a conductive gate structure disposed on a gate dielectric layer;

wherein said dielectric layer, after annealing and re-oxidizing, forms said gate dielectric layer; and further comprising the step of:

forming said conductive gate structure upon said gate dielectric layer.

9. The method according to claim 8 wherein said conductive gate is comprised of doped poly-silicon.

10. The method according to claim 8 wherein said gate dielectric is an ultra-thin silicon dioxide layer.

11. The method according to claim 8 further comprising the steps of forming source and drain and their respective contact to complete said transistor.

12. The method according to claim 1 wherein said integrated circuit structure includes a capacitor having a capacitor dielectric; and further comprising the steps of:

forming a first electrode over said substrate, said semiconductor surface present at said first electrode; and forming a second electrode on said dielectric layer;

wherein said dielectric layer forms said capacitor dielectric.

* * * * *